United States Patent
Wang et al.

(10) Patent No.: US 9,418,835 B2
(45) Date of Patent: Aug. 16, 2016

(54) METHODS FOR MANUFACTURING SEMICONDUCTOR DEVICES

(71) Applicant: INSTITUTE OF MICROELECTRONICS, CHINESE ACADEMY OF SCIENCES, Beijing (CN)

(72) Inventors: Guilei Wang, Beijing (CN); Jinbiao Liu, Beijing (CN); Junfeng Li, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/662,963

(22) Filed: Mar. 19, 2015

(65) Prior Publication Data

US 2016/0148799 A1 May 26, 2016

(30) Foreign Application Priority Data

Nov. 25, 2014 (CN) .......................... 2014 1 0685729

(51) Int. Cl.
*H01L 21/02* (2006.01)
*H01L 21/265* (2006.01)

(52) U.S. Cl.
CPC ...... *H01L 21/0217* (2013.01); *H01L 21/02211* (2013.01); *H01L 21/02274* (2013.01); *H01L 21/02329* (2013.01); *H01L 21/265* (2013.01)

(58) Field of Classification Search
CPC . H01L 21/02296; H01L 21/70; H01L 21/702; H01L 21/8232; H01L 27/01
See application file for complete search history.

(56) References Cited

U.S. PATENT DOCUMENTS

2011/0115051 A1* 5/2011 Kim .................. H01L 27/10817
257/532

* cited by examiner

*Primary Examiner* — Cheung Lee
(74) *Attorney, Agent, or Firm* — Pillsbury Winthrop Shaw Pittman LLP

(57) ABSTRACT

The present disclosure provides a method of manufacturing a semiconductor device having silicon nitride with a tensile stress, the method comprising: c1) introducing and pre-stabilizing $NH_3$ gas and $N_2$ gas; c2) introducing silane; c3) igniting the gases by a radio-frequency source; c4) depositing SiN; and c5) processing the SiN by using a nitrogen ion implantation. According to the present disclosure, the nitrogen content in the SiN film can be enhanced by the nitrogen ion implantation and impinging, thereby increasing the density of the film. In this way, the acid resistance of the SiN with tensile stress is enhanced, so that the SiN with tensile stress may be integrated in a dual-strained liner of a gate-last process, so as to effectively improve the properties and reliability of the device.

10 Claims, 1 Drawing Sheet

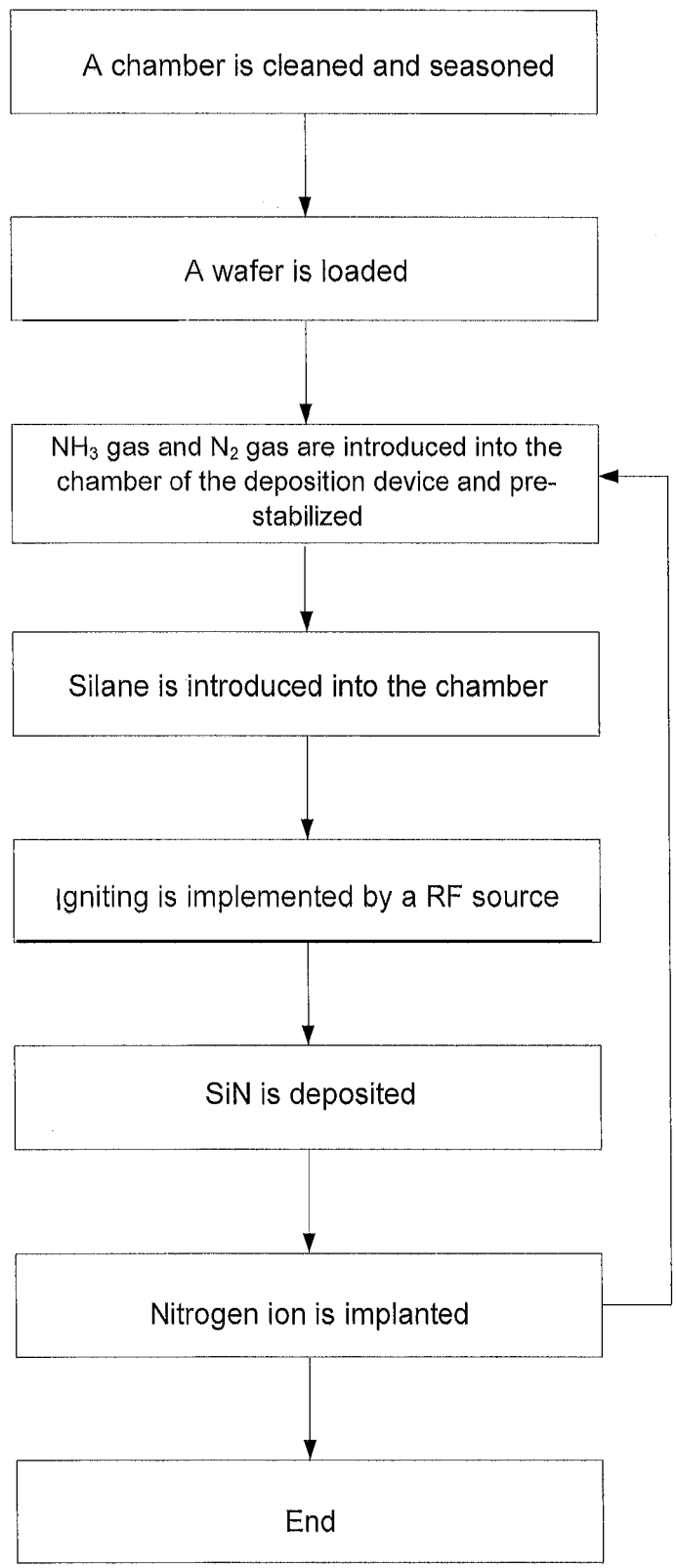

METHODS FOR MANUFACTURING SEMICONDUCTOR DEVICES

This application claims priority to Chinese Patent Application No. 201410685729.7, filed on Nov. 25, 2014, entitled "Methods for Manufacturing Semiconductor Devices," which application is incorporated herein in its entirety by reference.

TECHNICAL FIELD

The present disclosure relates to methods for manufacturing semiconductor devices, and particularly, to methods for manufacturing strained SiN with a tensile stress.

BACKGROUND

In the current field of semiconductor devices, methods of reducing cost merely by decreasing a characteristic size encounter bottlenecks. Particularly when the characteristic size is decreased below 150 nm, many physical parameters of semiconductor devices cannot be scaled down in proportion, for example, a Si band gap $E_g$, a fermi potential $\phi_F$, an interfacial state and oxide layer charge $Q_{OX}$, a thermoelectric potential $V_t$, a self-built potential of a pn junction, etc. These parameters affect the performance of the device which is scaled down in proportion. If it is desired to maintain beneficial and good properties of the device, the technology of enhancing carrier mobility is significant in scaling-down the CMOS in proportion. The switching speed of the device is enhanced by increasing the carrier mobility in the strained Si technology, which becomes a hot point for current research.

In order to further improve the device, strain is introduced to a channel region of a MOSFET, by using one or more different processes, to enhance the carrier mobility. For example, on a wafer with a crystal face of (100), a crystal orientation of the channel region is <110>. In a PMOS device, a compressive stress is used in a longitudinal direction (source/drain direction), and a tensile stress is used in a horizontal direction; while in a NMOS device, a tensile stress is used in a longitudinal direction, and a compressive stress is used in a horizontal direction. Recently, in a logic device with good properties, strained silicon, obtained by a planar coaxial process, is used. It has been developed to introduce a channel strain by depositing nitride cap layers (contact etch stop layer (CESL) SiN) with different types of stresses on the device structure. For example, SiN with a tensile stress is capped in a NMOS device to induce the channel strain and thus enhance the carrier mobility of the NMOS device. Similarly, a nitride cap layer with a compressive stress may be formed on a PMOS device structure to increase the carrier mobility of the PMOS device. For a NMOS device, a tensile stress of up to about 1.4 GPa is obtained by induction with the SiN film using the above process, and for the PMOS device, a compressive stress of up to about 3.0 GPa is obtained by induction with the SiN film using the above process.

SUMMARY

A dual-strained liner layers integration process as described above not only involves a high silicon nitride (SiN) strain, but also notably involves a good compactness and an etching resistance of the SiN film when a gate-last process is used. For example, in high-k and metal gate (HKMG) process integration, when a dummy gate and a liner oxide layer thereof are removed, dilute hydrofluoric acid (dHF) used for etching may damage the exposed strained layer to a large or even unacceptable extent, thereby seriously influencing the property of the device. When a dHF etchant (with a concentration (a volume ratio to water) of about 1:100 and a temperature of about 23° C.) is used, an etching rate of a thermal oxide (gate oxide) is 30 Å/min, an etching rate of SiN with a compressive stress is about 18.88 Å/min, and an etching rate of SiN with a tensile stress is about 498 Å/min. Thus, in the same etching condition, the etching rate of the SiN with a tensile stress deposited by using a conventional method in dHF is much faster than those of SiN with a compressive stress and the thermal oxide. Therefore, in order to adapt to the above mentioned etching process, it is difficult to integrate the SiN with a tensile stress deposited by using a conventional method in the dual-strained liner of the gate-last process.

Therefore, there is a need for a new method of manufacturing a strained SiN with a tensile stress, so that the manufactured SiN with tensile stress may meet process requirements.

The present disclosure proposes methods of manufacturing SiN with a tensile stress, which enables the obtained SiN with tensile stress to meet requirements of a current semiconductor process involving a nitrogen ion implantation process.

The present disclosure provides a method of manufacturing a semiconductor device to obtain SiN with a tensile stress, the method comprising:

c1) introducing and pre-stabilizing $NH_3$ gas and $N_2$ gas into a chamber of a deposition device, to enable gases in the chamber to be diffused uniformly and to maintain a stable pressure in the chamber;

c2) introducing silane into the chamber;

c3) igniting the gas using a radio-frequency source;

c4) after c1)-c3) are performed in sequence, depositing SiN with a tensile stress on a wafer, wherein c1)-c4) performed in sequence is a deposition cycle; and c5) processing the SiN by using a nitrogen ion implantation process.

In an aspect of the present disclosure, in step c1), a flow rate of the $NH_3$ gas is about 80 sccm and a flow rate of the $N_2$ gas is about 4000 sccm.

In an aspect of the present disclosure, in step c2), a flow rate of silane is about 20 sccm.

In an aspect of the preseant disclosure, step c3) comprises starting a radio frequency (RF) source of 40 W for 5 seconds while maintaining flow rates of the gases in steps c1) and c2).

In an aspect of the present disclosure, step c4) is performed for about 1.5 seconds, so that a thickness of the SiN deposited on the wafer is about 25 Å.

In an aspect of the present disclosure, during steps c1)-c4), the pressure in the chamber of the deposition device is stably controlled at about 6 Torr.

In an aspect of the present disclosure, step c5) further comprises (1) closing valves for the $NH_3$ gas and silane and keeping a valve for the $N_2$ gas open to continuously introduce $N_2$ up to about 4000 sccm in the same chamber of the deposition device, and starting a RF source of about 40 W to excite nitrogen plasma to impinge on a surface of the SiN; and/or (2) transferring the wafer with the SiN deposited thereon to a low-energy ion implantation chamber, and then implanting nitrogen ions into the SiN.

In an aspect of the present disclosure, steps c1)-c5) are performed repeatedly for many times, wherein step c5) is performed after each deposition cycle, or steps c1)-c5) are performed repeatedly many times, wherein step c5) is performed only after one or more selected deposition cycles.

In an aspect of the present disclosure, the method may further comprise, before step c1), a) cleaning and seasoning the chamber of the deposition device, which consumes about 120 seconds; and b) loading the wafer, which consumes about 5 seconds, wherein the deposition device is a dual-frequency capacitive coupling flat-plate type of plasma enhanced chemical vapor deposition (PECVD) device and a background vacuum in the chamber of the deposition device is less than or equal to about 30 mTorr.

The present disclosure may have one or more of the following advantages: SiN deposited by a nitrogen ion implantation process reduces the etching rate of the SiN with tensile stress in dHF, thus significantly enhancing the acid resistance thereof, and/or facilitating a process of integrating SiN into a dual-strained liner, and/or improving reliability of the device. In addition, since nitrogen ion implantation impinges the SiN film, the tensile stress of the SiN is enhanced, thus improved carrier mobility and enhanced properties of the device may be realized.

BRIEF DESCRIPTION OF THE DRAWINGS

FIG. 1 is a flowchart of a method according to the present disclosure.

DETAILED DESCRIPTION

The present disclosure will be described below with specific embodiments in connection with accompanying drawings. However, it should be understood that the descriptions here are only illustrative, without intention of limiting a scope of the present disclosure. Furthermore, the following description omits details of those known structures and techniques so that concepts of the disclosure are not obscured unnecessarily.

The present disclosure provides methods for manufacturing a semiconductor device, and particularly, to methods for manufacturing SiN with a tensile stress. The methods for manufacturing a semiconductor device according to the present disclosure will be described below in detail with reference to FIG. 1.

In an embodiment of the present disclosure, a SiN film with a tensile stress is deposited by a dual-frequency capacitive coupling flat-plate type of PECVD device and a low-energy ion implantation device using a PECVD process. In addition, in other embodiments of the present disclosure, other plasma devices (for example, PECVD (with different type of plate or different coupling mode), HDPCVD, PE ALD devices), deposition methods and/or ion implantation and impinging methods may be used to enable nitrogen ion implantation and impinging as mentioned in the present disclosure.

In an embodiment of the present disclosure, a temperature in a chamber of a PECVD device for depositing SiN is controlled to be within about 200-550° C., desirably about 400° C. A low frequency of a radio-frequency (RF) source is controlled to be within 106-188 KHz, desirably about 158 KHz, and a high frequency of the RF source is controlled to be about 13.56 MHz. The chamber of the device is evacuated by a device such as a molecular pump, an ionic pump, etc. An ideal value of a background vacuum is close to 0 (e.g., a background air pressure in the chamber is about 0). In practice, the background vacuum is desirably less than or equal to 30 mTorr according to a capability of the vacuum-pumping device. The nitrogen ion implantation process comprises introducing a $N_2$ gas continuously into the same chamber of the PECVD device, starting the RF source to excite a nitrogen plasma to impinge and implant the nitrogen into a SiN film (plasma implantation); or transferring a wafer to a chamber of a low-energy implanter, and implanting some dosage of nitrogen into the SiN film with low energy in a $N_2$ atmosphere, to improve nitrogen content and compactness of the SiN film; or firstly performing plasma implantation in the PECVD device and then implanting nitrogen ions in the implanter. In practice, the background vacuum is desirably less than or equal to $10^{-5}$ T according to the capability of the vacuum pumping device and the energy is desirably less than or equal to 5 KeV.

FIG. 1 illustrates a flowchart of a method according to an embodiment of the present disclosure. It should be noted that except for the "deposition" and "nitrogen ion implantation" steps, the remaining steps are desirable, and an order of these steps as well as number of times of repetition of these steps may be adjusted according to process requirements.

In a step a), a chamber is cleaned and seasoned. An inert gas such as $N_2$ gas, Ar gas, etc. is introduced, and a fluorine-containing compound may be added, for example carbon and fluorine-based gas such as $CF_4$, $CH_2F_2$, $CH_3F$, $CHF_3$, $XeF$ etc., to enhance the cleaning capability and to blow out the chamber to remove a residual product from the last reaction within the chamber and on the walls of the chamber. After the cleaning gas is introduced, a temperature may be suitably increased to facilitate the cleaning capability. Desirably, the temperature is maintained for a certain period to season the chamber, so that the interior of the chamber reaches equilibrium in all positions, for example, a distribution of a parameter such as temperature, pressure, etc. is uniform. The duration of step a) is about 120 seconds.

In a step b), a wafer is loaded. A door of the chamber of the device is opened, and one or more wafers (e.g., arranged in parallel in a wafer case or a similar fixing device) are transferred to the chamber and fixed in the chamber by controlling a mechanical arm or other holding device. The duration for step b) is about 5 seconds.

In a step c1), $NH_3$ gas and $N_2$ gas are introduced into the chamber of the deposition device and pre-stabilized, so that the gases in the chamber are diffused uniformly and maintained at a stable pressure in the chamber. A first valve is opened to introduce a first reactant gas functioning as a source of the nitrogen element, and a third valve is opened to introduce the $N_2$ gas. In an embodiment of the present disclosure, the first reactant gas is the $NH_3$ gas. The $N_2$ gas and the $NH_3$ gas are introduced for about 10 seconds. Flow rates of the $N_2$ gas and the $NH_3$ gas may be about 80 sccm and about 4000 sccm, respectively. In the reaction chamber, a second gas functioning as a source of the Si element is not introduced immediately, and instead, the $N_2$ gas and the $NH_3$ gas are maintained for a period so that the first reactant gas of $NH_3$ and the $N_2$ gas are diffused uniformly in the chamber and is maintained at a stable pressure in the chamber, desirably at about 6 Torr.

In a step c2), a second reactant gas is introduced, e.g., silane is introduced into the chamber. A second valve is opened to introduce the second reactant gas functioning as a source of the Si element, for example, silane, while the flow rates of the first reactant gas $NH_3$ and the $N_2$ gas are maintained as introduced in step c1). The second reactant gas is introduced at a flow rate of about 20 sccm for about 5 seconds, and the pressure in the chamber is stably kept at the same value as that in step c1), for example, about 6 Torr.

In a step c3), igniting of gas in the chamber is implemented by a RF source. The RF source is excited to start a high-frequency RF of 40 W for 5 seconds while the flow rates of the reactant gases in steps c1) and c2) are maintained and the pressure in the chamber is stably stabilized at about 6 Torr.

In a step c4), after the above mentioned steps of c1)-c3) are performed in sequence, a SiN with a tensile stress is deposited on the wafer. The SiN film with a tensile stress is deposited in step c4) while maintaining the conditions of the steps c1)-c3).

The duration for step c4) is about 1.5 seconds, so that a thickness of the SiN film deposited on the wafer is about 25 Å. In this case, the pressure in the chamber is stably maintained at about 6 Torr. The steps c1)-c4) are performed in sequence to form a deposition cycle. Within the deposition cycle, the pressure in the chamber is kept stable, for example, at about 6 Torr.

In a step c5), the SiN is processed by a nitrogen ion implantation process. In an embodiment of the present disclosure, the following procedure is performed in the PECVD device: closing the first valve and the second valve for the raw $NH_3$ gas and the raw silane gas, keeping the third valve for the $N_2$ gas open to introduce the $N_2$ gas continuously up to 4000 sccm, starting a high-frequency RF source of 40 W to excite a nitrogen plasma to impinge a surface of the SiN film formed in step c4). In an embodiment of the present disclosure, the wafer with SiN deposited thereon may be transferred to a low-energy ion implantation chamber and nitrogen ions are implanted into the SiN film through the low-energy ion implantation chamber. A process gas ($N_2$ in the present embodiment) may be ionized into ions ($N^+$ in the present embodiment) by a an electrical field in the low-energy ion implantation chamber, and then the ions are uniformly implanted into a sample (the wafer with SiN deposited thereon in the present embodiment) under an accelerating field at an implantation energy between 0.1-5 KeV and an implantation dosage between 1E13-1E17. Multiple graphite Faraday cups may be provided around the chamber to detect and monitor the implantation dosage. The two approaches as mentioned above can enhance the nitrogen content in the SiN, so as to increase the density of the film. In this way, the acid resistance and etching resistance of SiN with tensile stress may be enhanced, so that it may be integrated to a process for a dual-strained liner of a gate-last process, to effectively improve properties and/or reliability of the device. In an embodiment, the two approaches above may be used in combination.

In an embodiment, after steps a) and b) are completed, steps c1)-c5) are repeated a number of times, to get a SiN film with a desired thickness. In an embodiment of the present disclosure, steps c1)-c5) are performed 1-20 times, desirably 20 times. It should be noted that the nitrogen ion implantation in step c5) may be performed for any number of times. For example, step c5) may be performed after step c4) in each deposition cycle, to, for example, obtain an optimal effect. However, step c5) may be performed only after the step of c4) in a selected one or more deposition cycles. For example, the step c5) may be performed only after step c4) in the first or last several (for example, the first 5 or the last 5) deposition cycles, to enhance the acid resistance of at least a surface of the whole SiN film. However, desirably, in order to optimize the acid resistance of the SiN with tensile stress, step c5) is performed after step c4) in each deposition cycle, to enhance the acid resistance of each SiN sub-layer.

In step d), the procedure ends. After the desired number of times of cycles, the wafer is taken out, and the whole SiN deposition process is completed.

Compared to a conventional SiN with tensile stress, an etching rate of the SiN with tensile stress in the present disclosure in dHF is significantly decreased. When a dHF etchant (with a concentration (a volume ratio with respect to water) of 1:100 and at a temperature of 23° C.) is used, the etching rate of conventional SiN with tensile stress is about 498 Å/min, and the etching rate of SiN with tensile stress in the present disclosure can reach about 79 Å/min.

Thus, with the nitrogen ion implantation process, the etching rate of SiN with tensile stress in dHF is reduced, thus significantly enhancing the acid resistance thereof, facilitating a process of integrating SiN into a dual-strained liner of a gate-last process, and/or improving the reliability of the device. In addition, with the nitrogen ion implantation and impinging of the SiN film, the stress of the SiN layer is further enhanced, so that the stress of the finally formed SiN film may increase from 900 MPa without the process to 1200 MPa with the process. In this way, the tensile stress may be enhanced, thus facilitating further improvement in carrier mobility and/or enhancing properties of the device.

According to the method for manufacturing SiN with tensile stress of the present disclosure, the nitrogen content in the SiN film is enhanced by the nitrogen ion implantation, thus increasing the density of the film. In this way, the acid resistance of SiN with tensile stress may be enhanced, so that it may be integrated into a dual-strained liner of a gate-last process, thus effectively improving properties and/or reliability of the device.

The present disclosure has been described above with reference to one or more example embodiments. It should be understood that various suitable alternations and equivalents can be made to the device structure and/or process by one skilled person in the art without departing from the spirits and scope of the present disclosure. Moreover, the teachings of the present disclosure may make various modifications which may be adapted for particular situations or materials without departing from the spirit and scope of the present disclosure. Therefore, the object of the present disclosure is not limited to the above particular embodiments as desired implementations of the present disclosure. The device structure and the manufacture method thereof as disclosed will include all of embodiments falling within the scope of the present disclosure.

We claim:

1. A method of manufacturing silicon nitride with a tensile stress for a semiconductor device, the method comprising:
   c1) introducing and pre-stabilizing $NH_3$ gas and $N_2$ gas into a chamber of a deposition device, to enable the $NH_3$ gas and $N_2$ gas in the chamber to be diffused uniformly and to maintain a stable pressure in the chamber;
   c2) introducing silane into the chamber;
   c3) igniting the mixed gases of $NH_3$, $N_2$ and silane in the chamber using a radio-frequency source;
   c4) after c1)-c3) are performed in sequence, depositing SiN with a tensile stress on a wafer, wherein c1)-c4) performed in sequence is a deposition cycle; and
   c5) processing the SiN with a nitrogen ion implantation process.

2. The method according to claim 1, wherein in c1), a flow rate of the $NH_3$ gas is about 80 sccm and a flow rate of the $N_2$ gas is about 4000 sccm.

3. The method according to claim 1, wherein in c2), a flow rate of silane is about 20 sccm.

4. The method according to claim 1, wherein c3), comprises starting a radio-frequency source of 40 W for 5 seconds while maintaining flow rates of the gases in c1) and c2).

5. The method according to claim 1, wherein c4) is performed for about 1.5 seconds, so that a thickness of the SiN deposited on the wafer is about 25 Å.

6. The method according to claim 1, wherein during performing c1)-c4), the pressure in the chamber is stably controlled at about 6 Torr.

7. The method according to claim 1, wherein c5) further comprises (1) closing valves for the $NH_3$ gas and silane and keeping a valve for the $N_2$ gas open to continuously introduce $N_2$ up to about 4000 sccm in the same chamber of the deposition device, and starting a RF source of about 40 W to excite nitrogen plasma to impinge a surface of the SiN; and/or (2) transferring the wafer with the SiN deposited thereon to a low-energy ion implantation chamber, and then implanting nitrogen ions into the SiN.

8. The method according to claim 1, wherein c1)-c5) are performed repeatedly for many times, wherein c5) is performed after each deposition cycle.

9. The method according to claim 1, wherein c1)-c5) are performed repeatedly for many times, wherein c5) is performed only after one or more selected deposition cycles.

10. The method according to claim 1, further comprising, before c1), cleaning and seasoning the chamber of the deposition device which consumes about 120 seconds, and loading the wafer, which consumes about 5 seconds, wherein the deposition device is a dual-frequency capacitive coupling flat-plate type of plasma enhanced chemical vapor deposition (PECVD) device and a background vacuum in the chamber of the deposition device is less than or equal to about 30 mTorr.

* * * * *